US006523158B1

(12) United States Patent
Hidaka

(10) Patent No.: US 6,523,158 B1
(45) Date of Patent: Feb. 18, 2003

(54) WIRING DESIGNING METHOD FOR SEMICONDUCTOR INTEGRATED CIRCUIT

(75) Inventor: Itsuo Hidaka, Tokyo (JP)

(73) Assignee: NEC Corporation, Tokyo (JP)

( * ) Notice: Subject to any disclaimer, the term of this patent is extended or adjusted under 35 U.S.C. 154(b) by 115 days.

(21) Appl. No.: 09/684,335

(22) Filed: Oct. 10, 2000

(30) Foreign Application Priority Data

Oct. 12, 1999 (JP) .......................................... 11-289070

(51) Int. Cl.[7] ............................................... G06F 17/50
(52) U.S. Cl. ............................................. 716/10; 716/5
(58) Field of Search ................................ 716/10, 1–14

(56) References Cited

U.S. PATENT DOCUMENTS 3,890,635 A * 6/1975 Engeler ...................... 257/312
5,638,294 A * 6/1997 Sasada ........................ 716/13
5,687,088 A * 11/1997 Tomita ........................ 703/15
5,875,114 A * 2/1999 Kagatani et al. ............... 716/6
6,169,968 B1 * 1/2001 Kabuo ......................... 703/14
6,202,195 B1 * 3/2001 Tanaka et al. ................ 716/13
6,292,928 B1 * 9/2001 Yamaguchi et al. .......... 716/13
6,327,542 B1 * 12/2001 McBride ...................... 702/64

FOREIGN PATENT DOCUMENTS

| | | | |
|---|---|---|---|
| JP | 5-82646 | A | 4/1993 |
| JP | 8-330934 | | 12/1996 |
| JP | 9-147009 | A | 6/1997 |
| JP | 10-178100 | A | 6/1998 |
| JP | 11-40677 | A | 2/1999 |

* cited by examiner

*Primary Examiner*—Vuthe Siek
*Assistant Examiner*—Sun James Lin
(74) *Attorney, Agent, or Firm*—Foley & Lardner

(57) ABSTRACT

In a wiring designing method for a semiconductor integrated circuit, a signal line (201) is wired. Adjacent signal lines (204, 205), in which output ends **(204*o*, 205*o*) are opened, are mounted adjacently to the signal line (201). A capacitance is calculated which are formed by the signal line (201) and the adjacent lines (204, 205). Line lengths (L2, L3) of the adjacent lines (204, 205) are adjusted in accordance with the capacitance. The capacitance is changed by the adjustment of the line lengths (L2, L3**). Accordingly, it is possible to adjust the capacitance formed by the two signal lines adjacent to each other and a delay amount of the signal flowing through the signal line.

14 Claims, 9 Drawing Sheets

20
202
202i
202o
208
204
204i
204o
207
201
201i
201o
206
205
205i
205o
203
209
203i
203o
L2, L3
L1

WIRING DESIGNING METHOD FOR SEMICONDUCTOR INTEGRATED CIRCUIT

BACKGROUND OF THE INVENTION

1. Field of the Invention

The present invention relates to a wiring designing method for a semiconductor integrated circuit, which can adjust a delay amount of a signal flowing through a signal line of a semiconductor integrated circuit. More particularly, the present invention relates to a design support system for a semiconductor integrated circuit, which carries out the wiring designing method.

2. Description of the Related Art

A semiconductor integrated circuit is designed 15 by using a design support system. The design support system supports a circuit design and a layout design. The design support system is composed of a computer equipped with a CAD (Computer Aided Design) tool and a database.

FIG. 1 shows the configuration of a conventional design support system for a semiconductor integrated circuit. This design support system 1 is provided with an automatic placement tool 11, an automatic routing tool 12, an RC extraction tool 13, a delay calculation tool 14, a timing analysis tool 15, a correction value calculation tool 16 and a timing correction tool 17. Those tools are controlled by a processor in a computer. The processor refers to a tool program and a database stored in the computer to operate.

FIG. 2 shows the wiring sample of the conventional semiconductor integrated circuit. This semiconductor integrated circuit 2 is provided with a first signal line 21, a second signal line 22 and a third signal line 23. A first inverter 24 and a second inverter 25 are inserted in the first signal line 21.

An input end 21i of the first signal line 21 is coupled to an output buffer (not shown). An input end 22*i* of the second signal line 22 and an input end 23*i* of the third signal line 23 are connected to output buffers (not shown), respectively.

A delay amount of a signal flowing through the first signal line 21 is influenced by capacitance formed by the first signal line 21 and a wiring substrate. The delay amount of the signal flowing through the first signal line 21 is varied by changing a drive ability (an output level) of the output buffer coupled to the first signal line 21. The delay amount of the signal flowing through the first signal line 21 can be adjusted by changing the drive ability of the output buffer or changing a line length L0 of the first signal line 21 and accordingly changing the capacitance.

A technique for correcting a delay amount of a signal flowing through a signal line is disclosed in Japanese Laid Open Patent Application (JP-A-Heisei, 8-330934). This gazette discloses a technique for canceling the delay amount by using an advance signal in which a phase is more advanced than that of the signal flowing through the signal line and a delaying signal in which a phase is more delayed than that of the signal flowing through the signal line.

In order to change the drive ability of the output buffer, the output buffer has a magnification for a selectable drive ability. The number of selections is different for each output buffer. The magnification of the drive ability is represented by, for example, integer times such as ×1, ×2, ×4, . . . .

The magnification of the selectable drive ability is limited to the integer times, it brings about such a situation that a desirable delay amount can not be set. The change in the magnification of the drive ability of the output buffer causes an input capacitance of the output buffer to be changed, and thereby causes a delay amount of a signal line mounted at a former stage of a signal line to be changed. As mentioned above, the adjustment of a delay amount of a signal flowing through one signal line accordingly requires a re-adjustment of a delay amount of another signal line.

The change in a line length of a signal line naturally leads to a change in a placement position of a cell (a device group) to be coupled to the signal line on a chip. The cell exclusively occupies a placement area wider than that of the wiring, which results in the limitation on a placement position. An occurrence of a constraint on the line length of the signal line causes the matching between the line length and the placement position of the cell to be difficult.

The development in a fine fabrication technique makes an array interval between lines to be narrow. If the array interval between the lines is narrower, the capacitance formed by two signal lines adjacent to each other has influence on a delay amount. It is very difficult to design a wiring layout while carrying out the above-mentioned matching and also considering the capacitance between the two signal lines.

SUMMARY OF THE INVENTION

Therefore, an object of the present invention is to provide a wiring designing method for a semiconductor integrated circuit, which can adjust a capacitance formed by two signal lines adjacent to each other, and a delay amount of a signal flowing through a signal line.

Means for solving the above-mentioned problems are explained as follows. A number, a symbol and the like together with a parenthesis "( )" is given to a technical item appearing in the explanation. The number, the symbol and the like coincides with a reference number, a reference symbol and the like given to a technical item constituting at least one implementation or a plurality of embodiments among a plurality of implementations or a plurality of embodiments in the present invention, especially, a technical item illustrated in a drawing corresponding to the implementation or the embodiment. The reference number and the reference symbol clarify the correspondence and the relation between a technical item noted in a claim and the technical item in the implementation or the embodiment. The correspondence and the relation do not imply that the technical item noted in the claim is limited to the technical item in the implementation or the embodiment.

The wiring designing method for the semiconductor integrated circuit according to the present invention calculates a capacitance of a capacitor formed by a signal line (201) and adjacent lines (204, 205) adjacent to the signal line (201), and adjusts line lengths (L2, L3) of the adjacent lines (204, 205) based on the calculated capacitance.

Another wiring designing method for a semiconductor integrated circuit according to the present invention calculates a delay amount of a signal flowing through the signal line (201), and calculates a delay difference indicative of a difference between the calculated delay amount and a desirable delay amount, and then adjusts the line lengths of the adjacent lines (204, 205) based on the calculated delay difference.

Still another designing method for a semiconductor integrated circuit according to the present invention calculates a differential capacitance corresponding to the delay difference, and adjusts the line length based on the differential capacitance and a distributed capacitance rate of an adjacent line.

Still another designing method for a semiconductor integrated circuit according to the present invention determines a phase of a control signal supplied to the adjacent lines (204, 205), based on a direction of a phase shift of the signal flowing through the signal line (201).

In still another designing method for a semiconductor integrated circuit according to the present invention, when the direction of the phase sift indicates a phase delay of a signal flowing through the signal line (201), the control signal supplied to the adjacent lines (204, 205) is set to a fixed potential having no phase.

In still another designing method for a semiconductor integrated circuit according to the present invention, when the direction of the phase shift indicates a phase advance of the signal flowing through the signal line (201), the control signal supplied to the adjacent lines is set to a first control signal having the same phase as the signal flowing through the signal line (201).

In still another designing method for a semiconductor integrated circuit according to the present invention, when the direction of the phase shift indicates a phase delay of the signal flowing through the signal line (201), the control signal supplied to the adjacent lines (204, 205) is set to a second control signal having a phase opposite to the signal flowing through the signal line (201).

A design support system for a semiconductor integrated circuit according to the present invention is comprises a signal line (201), a routing tool (102) and timing adjustment tools (106, 107). The routing tool (102) wires adjacent lines (204, 205) whose output ends are opened, and located adjacently to the signal line (201). The timing adjustment tools (106, 107) determines line lengths of the adjacent lines (204, 205), based on a delay amount of a signal flowing through the signal line (201).

In another design support system for a semiconductor integrated circuit according to the present invention, the timing adjustment tools (106, 107) measure a delay amount of a signal flowing through the signal line (201), and calculate a delay difference indicative of a difference between the measured delay amount and a desirable delay amount, and then adjust the line length of the adjacent lines (204, 205) based on the calculated delay difference.

In still another design support system for a semiconductor integrated circuit according to the present invention, the timing adjustment tools (106, 107) calculate a differential capacitance corresponding to the delay difference, and adjust the line length of the adjacent lines (204, 205) by referring to the differential capacitance and a distributed capacitance rate of the adjacent line.

In still another design support system for a semiconductor integrated circuit according to the present invention, the timing adjustment tools (106, 107) determine a phase of a control signal supplied to the adjacent lines, based on a direction of a phase shift of the signal flowing through the signal line (201).

In still another design support system for a semiconductor integrated circuit according to the present invention, when the direction of the phase shift indicates a phase delay of a signal, the timing adjustment tools (106, 107) set the control signal supplied to the adjacent lines at a fixed potential having no phase.

In still another design support system for a semiconductor integrated circuit according to the present invention, when the direction of the phase shift indicates a phase advance of the signal flowing through the signal line (201), the timing adjustment tools (106, 107) set the control signal supplied to the adjacent lines at a first control signal having the same phase as the signal flowing through the signal line (201).

In still another design support system for a semiconductor integrated circuit according to the present invention, when the direction of the phase shift indicates a phase delay of the signal flowing through the signal line (201), the timing adjustment tools (106, 107) set the control signal supplied to the adjacent lines at a second control signal having a phase opposite to the signal flowing through the signal line (201).

DESCRIPTION OF THE PREFERRED EMBODIMENTS

Figure 1:
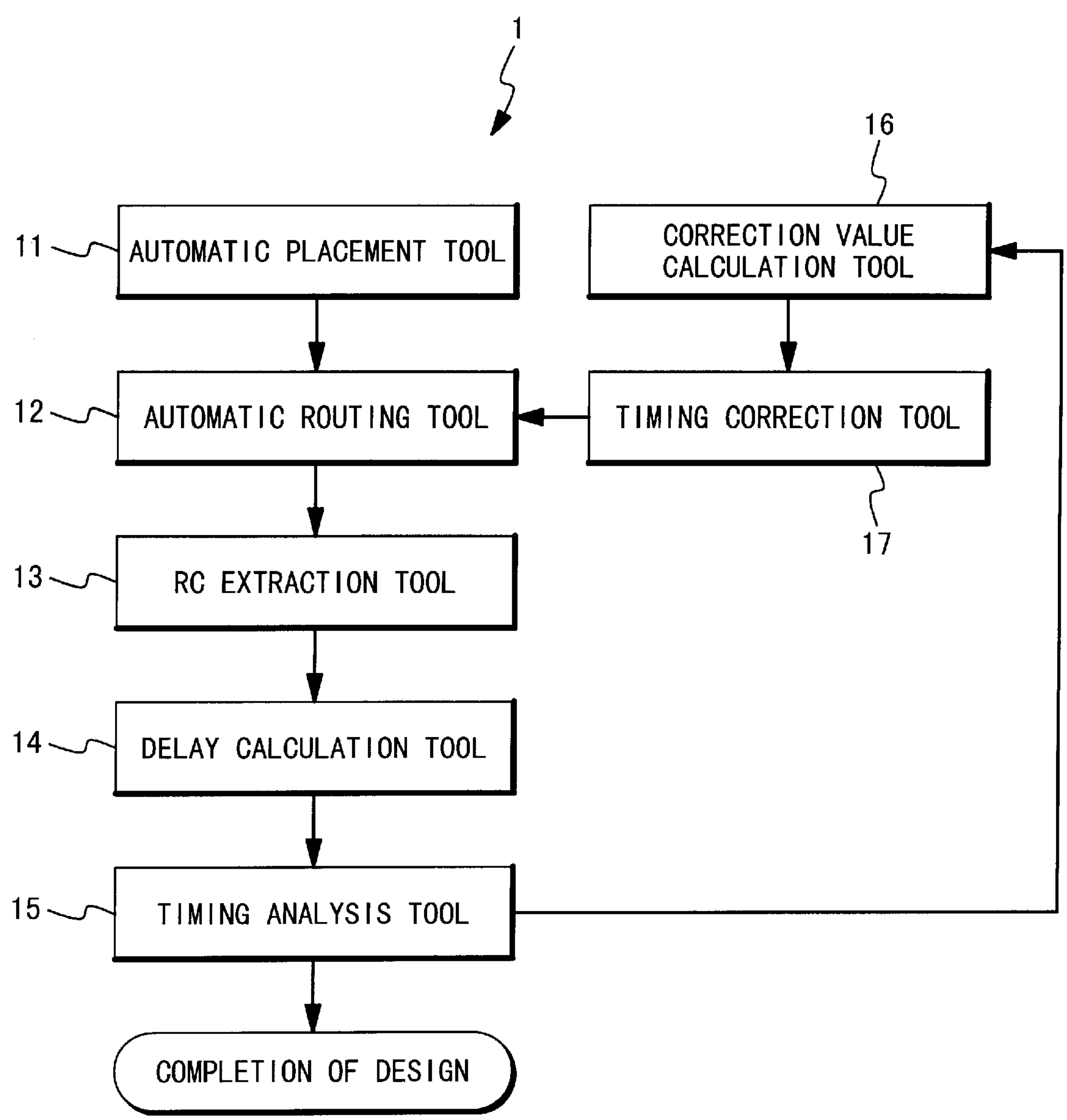
FIG. 1 shows a configuration of a conventional design support system for a semiconductor integrated circuit.
Figure 2:
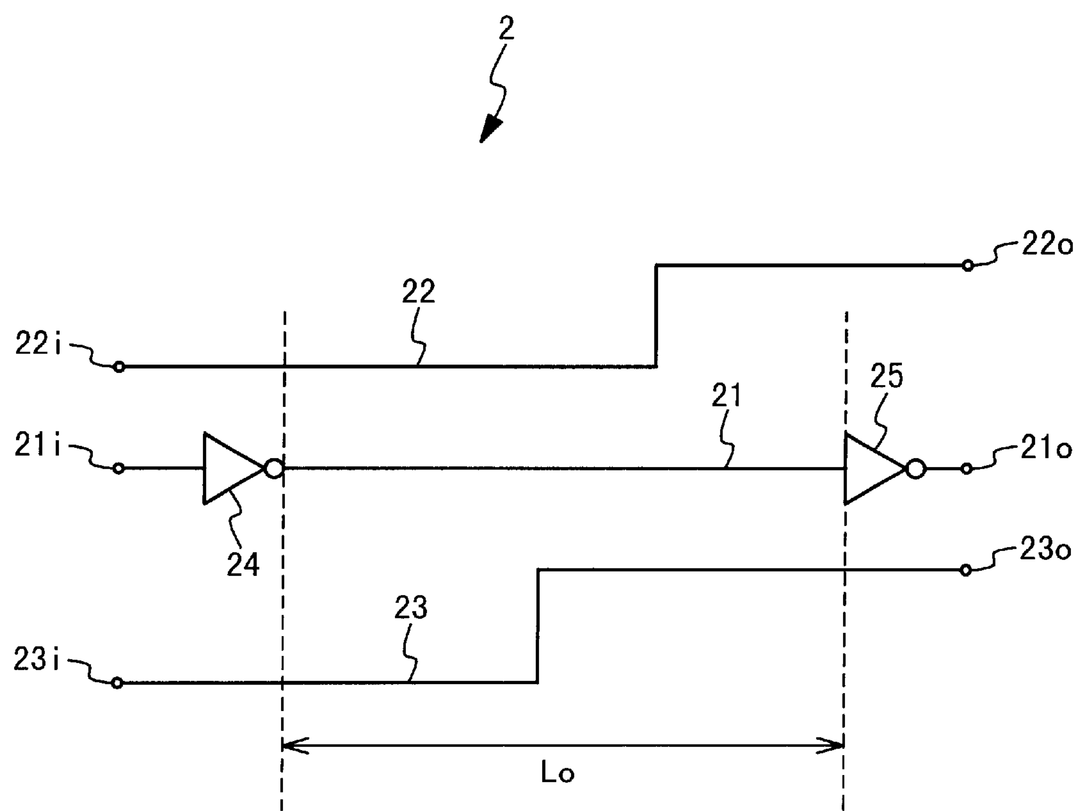
FIG. 2 shows a conventional wiring sample of a semiconductor integrated circuit.
Figure 3:
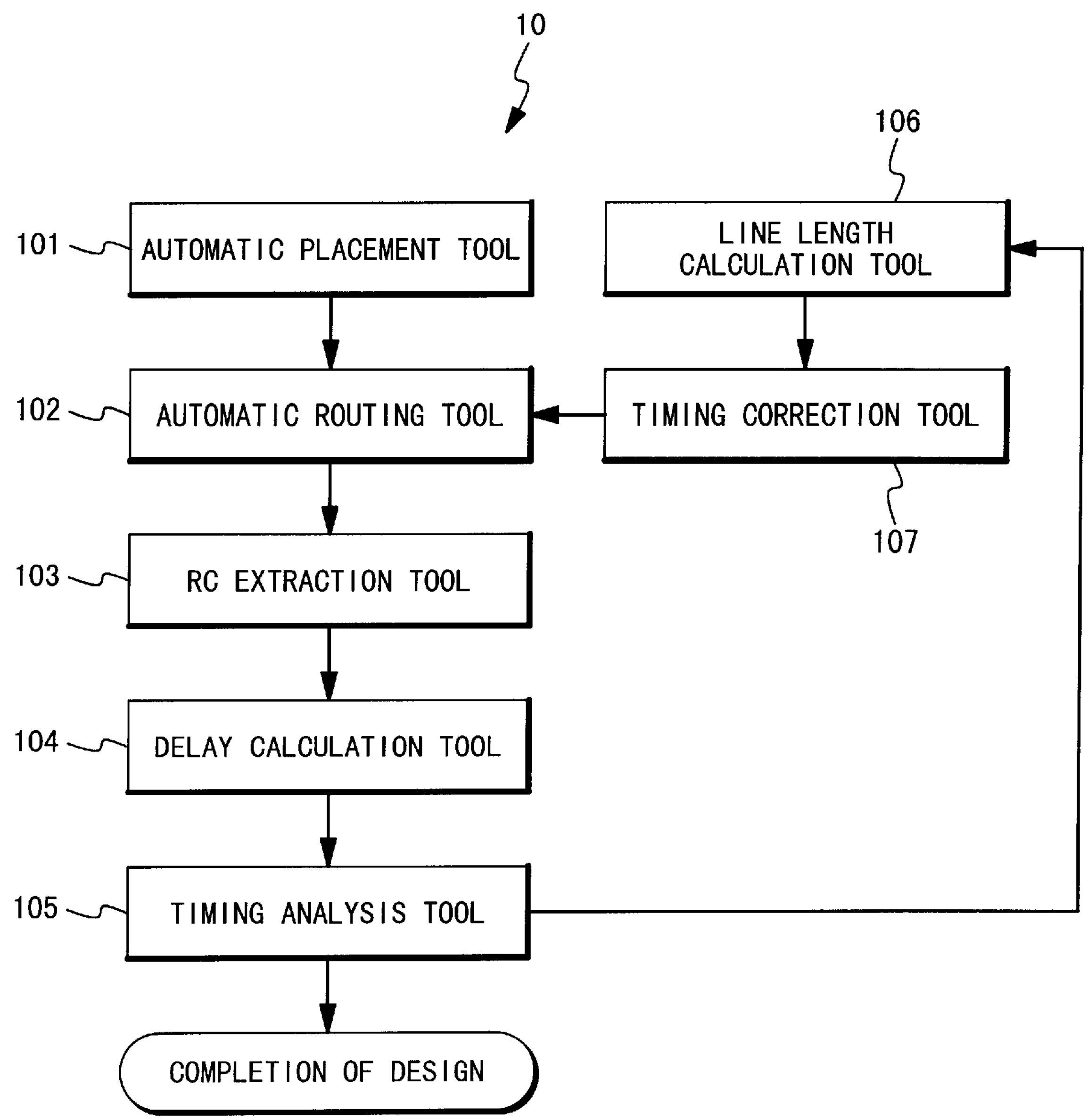
FIG. 3 shows a configuration of a design support system for a semiconductor integrated circuit according to the present invention.

FIG. 3 shows a configuration of a design support system for a semiconductor integrated circuit according to the present invention. This design support system 10 is composed of an automatic placement tool 101, an automatic routing tool 102, an RC extraction tool 103, a delay calculation tool 104, a timing analysis tool 105, a line length calculation tool 106 and a timing correction tool 107.

The automatic placement tool 101 determines a placement position of a cell of a semiconductor integrated circuit. The automatic routing tool 102 determines a wiring route of a signal line. The RC extraction tool calculates a resistance value and a capacitance value of wiring. The delay calculation tool 104 calculates a delay amount of a signal flowing through the signal line. The timing analysis tool 105 detects a transmission timing of the signal flowing through the signal line. The line length calculation tool 106 calculates a line length of an adjacent line based on the analysis result of the timing analysis tool 105. Also, the timing correction tool 107 determines the line length of the adjacent line and a control signal supplied to the adjacent line, based on with the calculation result of the line length calculation tool 106.

Those tools are controlled by a processor in a computer. The processor refers to a tool program and a database stored in the computer to operate.

Figure 4:
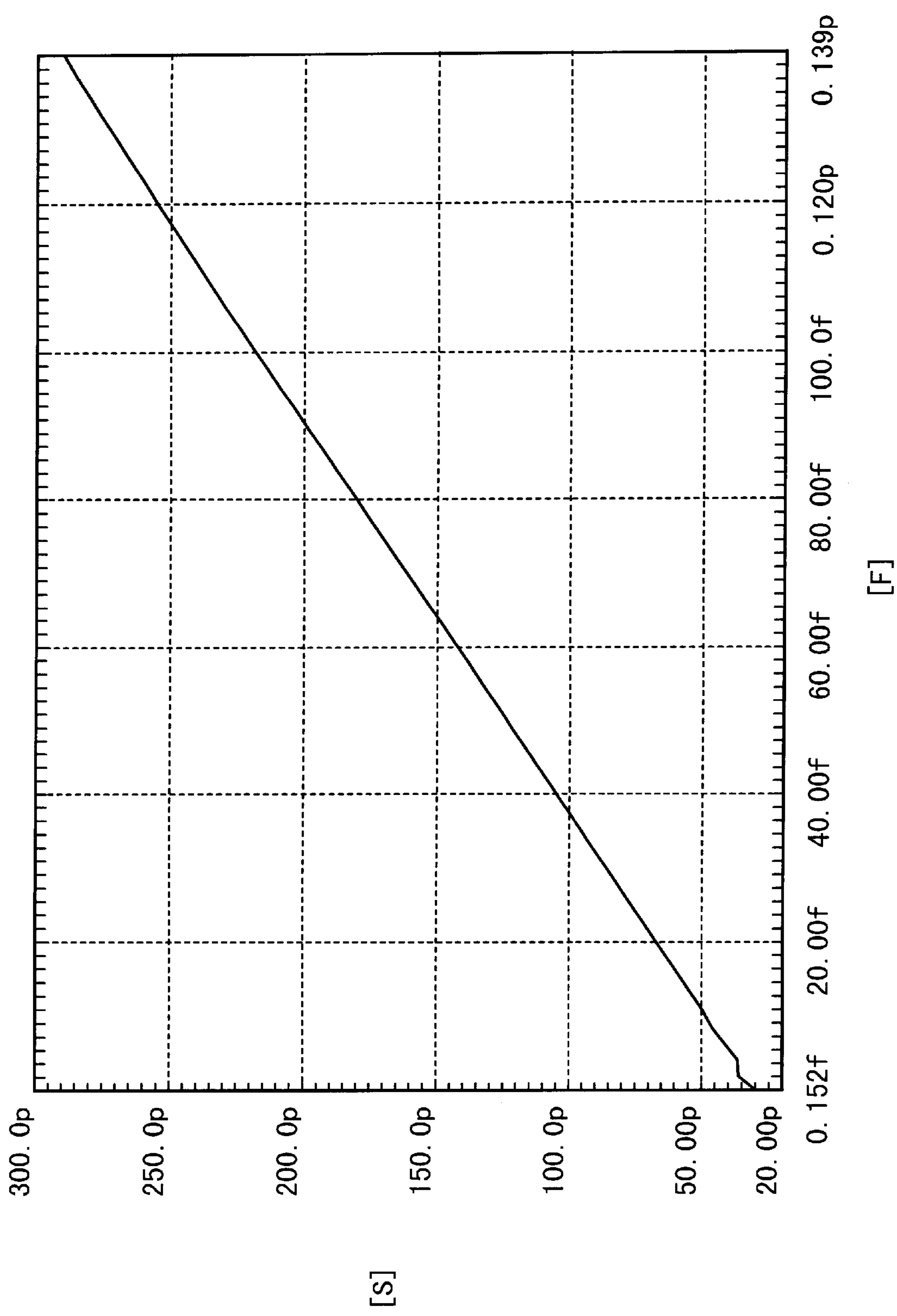
FIG. 4 shows a graph of a capacitance characteristic according to the present invention.
Figure 5:
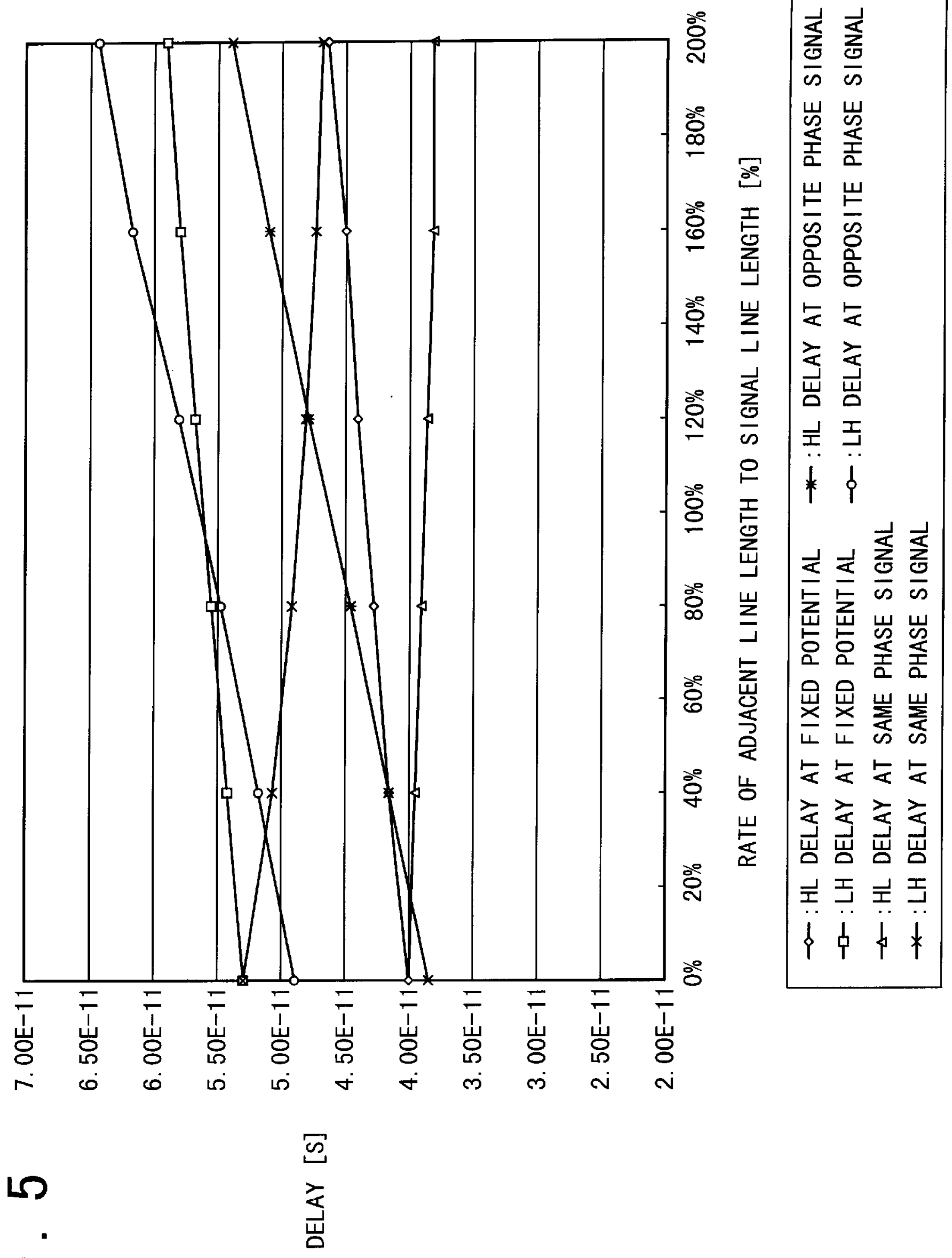
FIG. 5 shows a graph of a characteristic waveform of a control signal according to the present invention.

The line length calculation tool 106 calculates the line length of the adjacent line while referring to the delay correspondence tables shown in FIGS. 4 and 5.

FIG. 4 shows a graph of a capacitance characteristic according to the present invention. This graph of the capacitance characteristic is the correspondence table showing a corresponding relation between a capacitance and a delay amount. A vertical axis of the graph of the capacitance characteristic indicates a time (sec). A horizontal axis thereof indicates a capacitance (F). The capacitance is formed by the signal line and the adjacent line. A delay amount implies a delay amount of the signal flowing through the signal line. If the capacitance is 40 femto-Farad, a delay of 105 pico-second is induced in the signal flowing through the signal line. If the capacitance is 0.12 pico-Farad, a delay of 255 pico-second is induced in the signal flowing through the signal line.

The timing correction tool 107 sends an instruction of a re-routing and a kind of a control signal to the automatic routing tool 102. The automatic routing tool 102 selects a suitable control signal from a fixed potential, a first control signal and a second control signal. The fixed potential is selected when a phase of the signal flowing through the signal line is desired to be delayed. The first control signal is selected when the phase of the signal flowing through the signal line is desired to be advanced. Also, the second control signal is selected when the phase of the signal flowing through the signal line is desired to be delayed. The phase delay when the second control signal is supplied is greater than the phase delay when the fixed potential is applied.

FIG. 5 shows graph of a characteristic waveform of the control signal according to the present invention. A vertical axis of the graph showing the characteristic waveform indicates a delay time (sec). A horizontal axis indicates a rate (%) of a line length of an adjacent line to a line length of a signal line. As the rate, 0 to 200 (%) is shown in FIG. 5. If one adjacent line is arranged for one signal line, a numeral between 0 and 100 (%) is referred. If two adjacent lines are arranged for one signal line, a numeral between 0 and 200 (%) is referred. The rate of 100 (%) indicates such a state that in a case of one adjacent line, a line length of the adjacent line is set to be equal to a line length of the signal line. The rate of 100 (%) also indicates such a state that in a case of two adjacent lines, the line lengths of the adjacent lines are respectively set to 50 (%) of the line length of the signal line. A case of a rate of 120 (%) indicates such a state that two adjacent lines whose line lengths are respectively set to 60 (%) of the line length of the signal lines are prepared. A case of a rate of 200 (%) indicates such a state that two adjacent lines whose line lengths are respectively set to 100 (%) of the line length of the signal lines are prepared.

One adjacent line or a plurality of adjacent lines is provided to one signal line. If two adjacent lines are provided to one signal line, the adjacent lines are located above and below or to the left and right of the signal line. If the fixed potential is applied to the adjacent line, the delay amount is varied proportionally to the line length of the adjacent line. The adjacent lines may be arranged in the form of a coil in which the adjacent lines wrap around the signal line.

When the first control signal that is the signal having the same phase as the signal flowing through the signal line is supplied to the adjacent line, the delay amount of the signal flowing through the signal line is varied inversely proportional to the line length of the adjacent line. When the second control signal that is the signal having the phase opposite to that of the signal flowing through the signal line is supplied to the adjacent line, the delay amount is varied proportionally to the line length of the adjacent line.

In the example of FIG. 5, when the fixed potential is applied to the adjacent line, a delay amount at a rising edge (LH) of a signal is greater than a delay amount at a trailing edge (HL) of the signal. When the first control signal is supplied to the adjacent line, a delay amount at a rising edge (LH) of the signal is greater than a delay amount at a trailing edge (HL) of the signal. Also, if the second control signal is supplied to the adjacent line, a delay amount at a rising edge (LH) of the signal is greater than a delay amount at a trailing edge (HL) of the signal.

The design support system 10 according to the present invention can refer to a data with regard to the rising edge and a data with regard to the trailing edge to thereby execute the process. The design support system 10 can refer to an average between those data to thereby execute the process.

Figure 6:
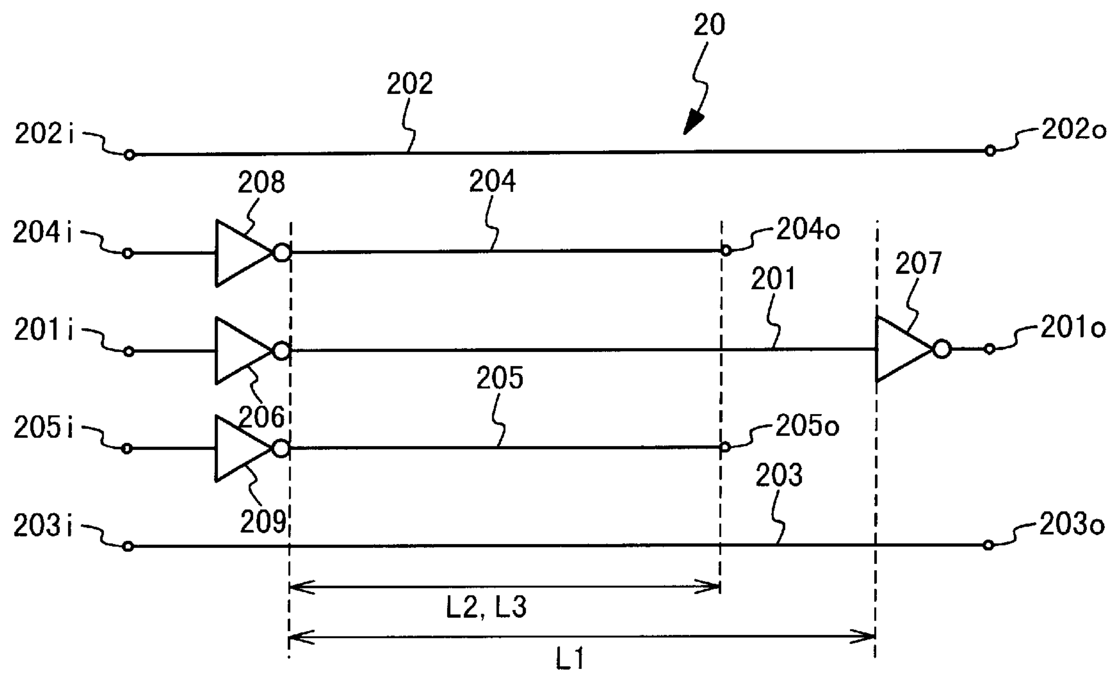
FIG. 6 shows a wiring sample of a semiconductor integrated circuit according to the present invention.

FIG. 6 shows the wiring sample of the semiconductor integrated circuit according to the present invention. The semiconductor integrated circuit 20 is composed of a first signal line 201, a second signal line 202, a third signal line 203, a first adjacent line 204 and a second adjacent line 205. The first signal line 201 has an input end 201*i* and an output end 201*o*. A first inverter 206 and a second inverter 207 are inserted to the first signal line 201. The second signal line 202 has an input end 202*i* and an output end 202*o*. The third signal line 203 has an input end 203*i* and an output end 203*o*. The first adjacent line 204 has an input end 204*i* and an output end 204*o*. An inverter 208 is inserted to the first adjacent line 204. The second adjacent line 205 has an input end 205*i* and an output end 205*o*. An inverter 209 is inserted to the second adjacent line 205.

The input end 201i of the first signal line 201 is coupled to an output buffer (not shown). The input end 202*i* of the second signal line 202 and the input end 203*i* of the third signal line 203 are connected to output buffers (not shown), respectively. The input end 204*i* of the first adjacent line 204 and the input end 205*i* of the second adjacent line 205 are connected to output buffers (not shown), respectively.

A line length between the output terminal of the first inverter 206 and the input terminal of the second inverter 207 is set at L1. It is possible to change a line length L2 between the output terminal of the third inverter 208 and the output end 204*o*. It is also possible to change a line length L3 between the output terminal of the fourth inverter 209 and the output end 205*o*.

Figure 7:
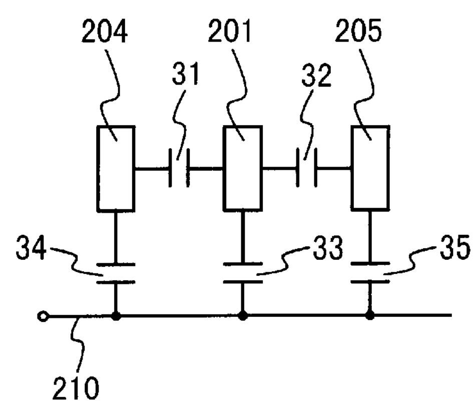
FIG. 7 shows a location of a capacitance in a semiconductor integrated circuit according to the present invention.

FIG. 7 shows a location of the capacitance in the semiconductor integrated circuit according to the present invention. A circuit shown in FIG. 7 is a part of the semiconductor integrated circuit 20 shown in FIG. 6.

A first capacitor 31 is formed between the first signal line 201 and the first adjacent line 204. A second capacitor 32 is formed between the first signal line 201 and the second adjacent line 205. A third capacitor 33 is formed between the first signal line 201 and a substrate 210. A fourth capacitor 34 is formed between the first adjacent line 204 and the substrate 210. Also, a fifth capacitor 35 is formed between the second adjacent line 205 and the substrate 210.

By changing the line length L2 of the first adjacent line 204, a capacitance C1 of the first capacitor 31 is changed. Also, by changing the line length L3 of the second adjacent line 205, a capacitance C2 of the second capacitor 32 is changed.

Now, the wiring designing method for the semiconductor integrated circuit according to the present invention will be described below with reference to FIGS. 3 to 7. Here, a process is described for adjusting a delay amount of a signal flowing through the first signal line 201.

The automatic placement tool 101 arranges cells (not shown) such that an assembly region is effectively used. The automatic routing tool 102 wires the first to third signal lines 201 to 203. Also, the automatic routing tool 102 wires the first and second adjacent lines 204 and 205. The first to fourth inverters 206 to 209 are inserted in those lines. The RC extraction tool 103 detects the resistance values of the resistors and the capacitance values of capacitors formed by the first to third signal lines 201 to 203. Also, the RC extraction tool 103 detects the resistance values of the resistors and the capacitance values of the capacitors formed by the first and second adjacent lines 204 and 205. The delay calculation tool 104 refers to the resistance values of the resistors and capacitance values which are detected by the RC extraction tool 103, and calculates the delay amount of the signal flowing through the first signal line 201. The timing analysis tool 105 analyzes for determining whether or not the delay amount of the signal flowing through the first signal line 201 is an allowable value. The design is completed if the analyzed result of the timing analysis tool 105 indicates "Allowance".

If the analyzed result of the timing analysis tool 105 indicates "Rejection", the line length calculation tool 106 is actuated. The line length calculation tool 106 refers to the delay amount correspondence table (refer to FIG. 4), and calculates a line length of an adjacent line. In this calculation of the line length, a delay difference Tdef between a desirable delay amount and a current delay amount are calculated. The delay difference Tdef is converted into a differential capacitance Cdef.

The differential capacitance Cdef is represented by "Cdef=∈ (s/d)" The "∈ " denotes a dielectric constant. The "s" denotes an opposite area between a signal line and an adjacent line. Also, the "d" denotes an opposite length between the signal line and the adjacent line. The line length of the adjacent line is calculated by this equation. The line length calculated by the line length calculation tool 106 is sent to the timing correction tool 107.

It is also possible to refer to a distributed capacitance rate (a capacitance per a unit length). A change amount of the line length of the adjacent line can be calculated by dividing the differential capacitance by the distributed capacitance rate.

The timing correction tool 107 refers to the received line length, and sends such an instruction that the line lengths of the adjacent lines 204 and 205 should be changed to the automatic routing tool 102. The automatic routing tool 102 changes the line lengths of the adjacent lines 204 and 205, and actuates the RC extraction tool 103.

Also, the timing correction tool 107 selects a control signal to be sent to the adjacent lines 204 and 205 in addition to the correction of the line lengths of the adjacent lines. The control signal is selected in accordance with an adjustment direction of a phase of the signal flowing through the signal line and its degree. The timing correction tool 107, if advancing the phase of the signal, sends the first control signal having the same phase as the signal flowing through the signal line to the adjacent lines. The timing correction tool 107, if largely delaying the phase of the signal, sends the second control signal having an opposite phase to the signal flowing through the signal line, to adjacent lines. The timing correction tool 107, if slightly delaying the phase of the signal, applies the fixed potential to the adjacent lines.

Figure 8:
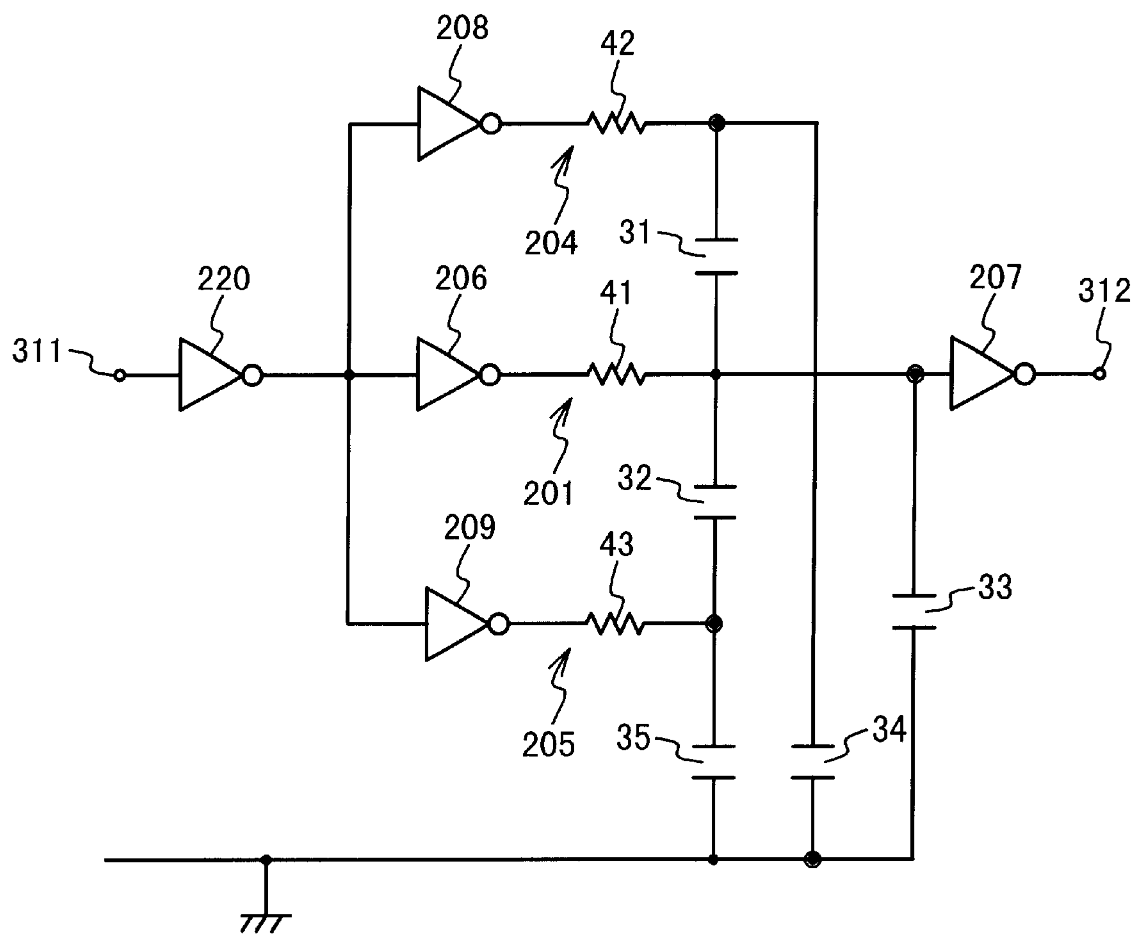
FIG. 8 shows an equivalent circuit of a first wiring sample of a semiconductor integrated circuit according to the present invention.

FIG. 8 shows an equivalent circuit of a first wiring sample of a semiconductor integrated circuit according to the present invention. FIG. 8 shows in detail the signal line 201 and the first and second adjacent lines 204 and 205 shown in FIG. 6. The first control signal is supplied to the adjacent lines 204 and 205 which is connected to inverters 208 and 209 shown in FIG. 8.

A signal inputted to the first and second adjacent lines 204, 205 and a signal line 201 connected to a first inverter 206 is supplied through an inverter 220. A signal from the signal line 201 is outputted to an output end 312 through a second inverter 207. An equivalent resistor 41 is formed between the first inverter 206 and the second inverter 207. An equivalent resistor 42 is formed on an output side of the third inverter 208. An equivalent resistor 43 is formed on an output side of the fourth inverter 209.

A capacitor 31 is formed between the signal line 201 and the adjacent line 204. A capacitor 32 is formed between the signal line 201 and the adjacent line 205. A capacitor 33 is formed between the signal line 201 and a ground terminal (substrate). A capacitor 34 is formed between the adjacent line 204 and the ground terminal. Also, a capacitor 35 is formed between the adjacent line 205 and the ground terminal. The RC extraction tool 103 extracts the resistance values of the equivalent resistors 41 to 43 and the capacitance values of the capacitors 31 to 35.

The first control signal having the same phase as the signal flowing through the signal line 201 is supplied to the adjacent lines 204 and 205. The first control signal is generated in accordance with the signal flowing through the signal line 201. As a result, a phase of the signal flowing through the signal line 201 is advanced.

Figure 9:
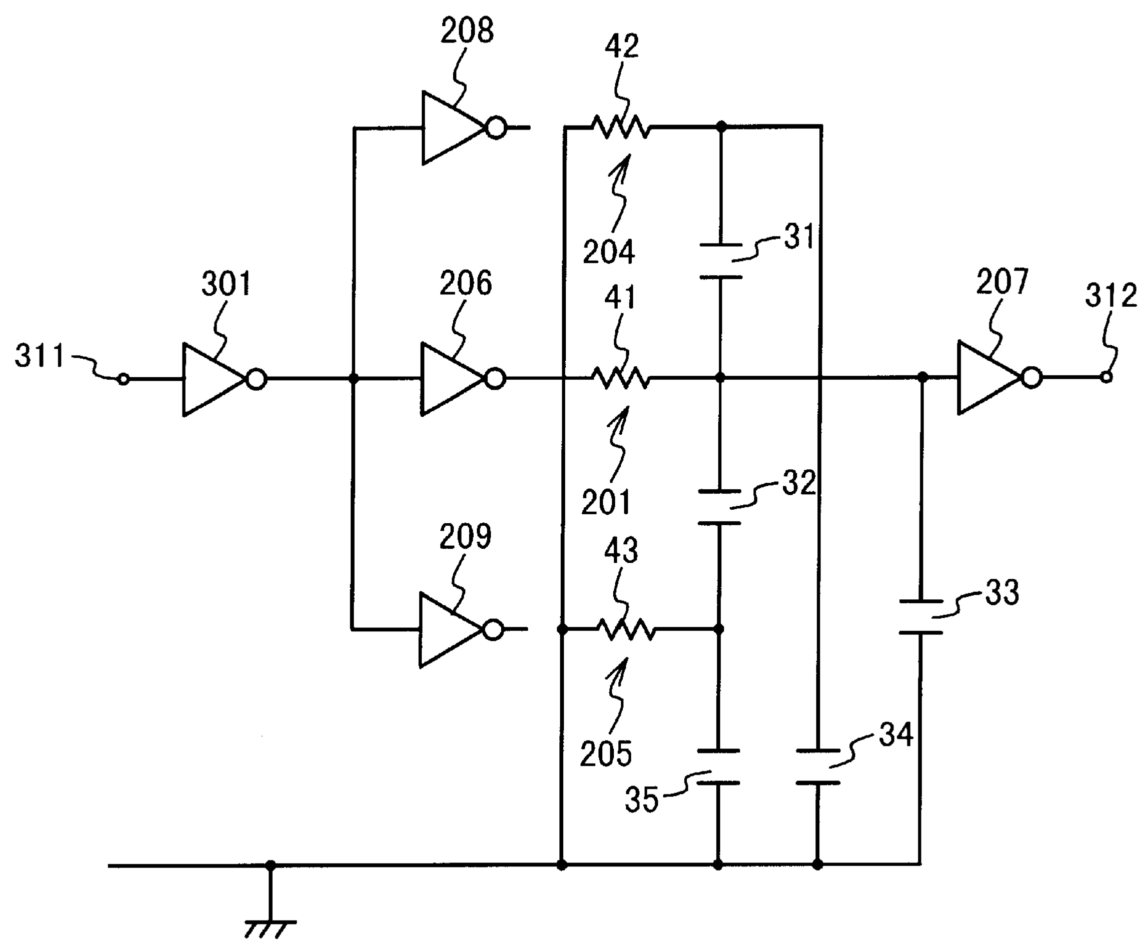
FIG. 9 shows an equivalent circuit of a second wiring sample of a semiconductor integrated circuit according to the present invention.

FIG. 9 shows an equivalent circuit of a second wiring sample of the semiconductor integrated circuit according to the present invention. FIG. 9 shows in detail the signal line 201 and the first and second adjacent lines 204 and 205 shown in FIG. 6. The adjacent lines 204 and 205 are separated from the output terminals of the inverters 208 and 209, respectively. Then, the fixed potential is supplied to the adjacent lines 204 and 205.

A signal inputted to the signal line 201 connected to an inverter 206 is supplied through an inverter 301. A signal from the signal line 201 is outputted to an output end 312 through the second inverter 207. The inverter 301 supplies a signal to the inverter 206. An equivalent resistor 41 is formed between the first inverter 206 and a second inverter 207. An equivalent resistor 42 is formed on the adjacent line 204. Also, an equivalent resistor 43 is formed on the adjacent line 205. Since the adjacent lines 204 and 205 are separated from the output terminals of the inverters 208 and 209, and connected to the ground terminal, the equivalent resistors 42 and 43 are connected to the ground terminal as shown FIG. 9.

A capacitor 31 is formed between the signal line 201 and the adjacent line 204. A capacitor 32 is formed between the signal line 201 and the adjacent line 205. A capacitor 33 is formed between the signal line 201 and a ground terminal (substrate). A capacitor 34 is formed between the adjacent line 204 and the ground terminal. Also, a capacitor 35 is formed between the adjacent line 205 and the ground terminal. The RC extraction tool 103 extracts the resistance values of the equivalent resistors 41 to 43 and the capacitance values of the capacitors 31 to 35.

Figure 10:
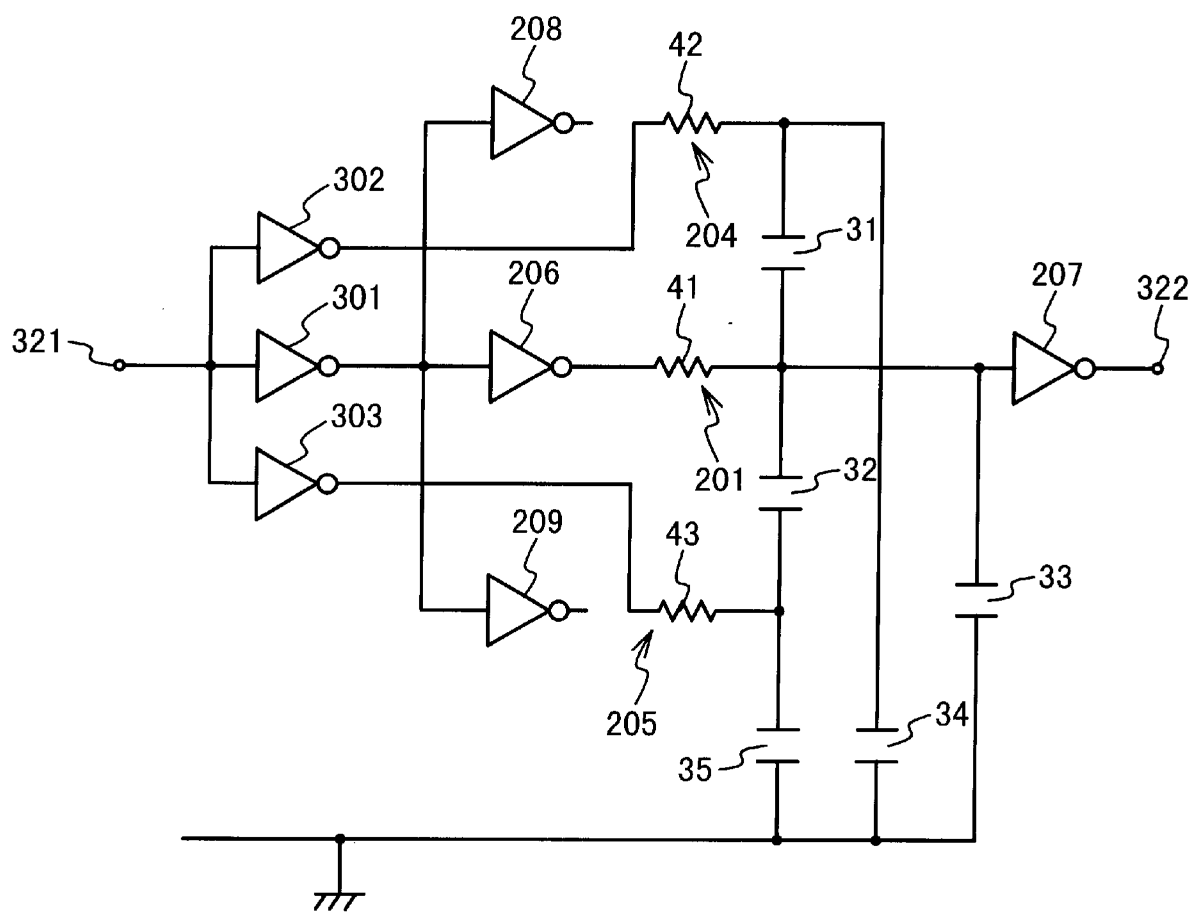
FIG. 10 shows an equivalent circuit of a third wiring sample of a semiconductor integrated circuit according to the present invention.

The fixed potential is supplied to the adjacent lines 204 and 205. As a result, a phase of the signal flowing through the signal line 201 is delayed. FIG. 10 shows an equivalent circuit of a third wiring sample of the semiconductor integrated circuit according to the present invention. FIG. 10 shows in detail the signal line 201 and the first and second adjacent lines 204 and 205 shown in FIG. 6. The adjacent lines 204 and 205 are separated from the output terminals of the inverters 208 and 209, respectively. Then, the second control signal is supplied to the adjacent lines 204 and 205 through inverters 302 and 303, respectively.

A signal inputted to the signal line 201 connected to an inverter 206 is supplied through an inverter 301. Signals inputted to the first and second adjacent lines 204 and 205 are supplied through an inverter 302 and 303, respectively. A signal from the signal line 201 is outputted to an output end 322 through the second inverter 207. The inverter 301 sends a signal to the inverter 206. A signal, which is equivalent to the signal flowing through the signal line 201, is supplied to the input end 321. The second control signal having the opposite phase to the signal flowing through the signal line 201 is supplied to the adjacent lines 204 and 205.

An equivalent resistor 41 is formed between the first inverter 206 and a second inverter 207. An equivalent resistor 42 is formed on the adjacent line 204. Also, an equivalent resistor 43 is formed on the adjacent line 205.

A capacitor 31 is formed between the signal line 201 and the adjacent line 204. A capacitor 32 is formed between the signal line 201 and the adjacent line 205. A capacitor 33 is formed between the signal line 201 and a ground terminal (substrate). A capacitor 34 is formed between the adjacent line 204 and the ground terminal. Also, a capacitor 35 is formed between the adjacent line 205 and the ground terminal. The RC extraction tool 103 extracts the resistance values of the equivalent resistors 41 to 43 and the capacitance values of the capacitors 31 to 35.

The second control signal is supplied to the adjacent lines 204 and 205. As a result, a phase of the signal flowing through the signal line 201 is delayed. Its delay amount is greater than that of the case that the fixed potential is supplied to the adjacent lines 204 and 205.

According to the wiring designing method of the semiconductor integrated circuit of the present invention, when the line length of the adjacent line is varied, the capacitance formed by the signal line and the adjacent line is changed. If the capacitance is changed, the delay amount of the signal flowing through the signal line is changed. It is not necessary to change the line length of the signal line when the delay amount of the signal flowing through the signal line is adjusted. The delay amount of the signal flowing through the signal line does not receive the influence of another signal line located adjacently through the adjacent line. Thus, there is no situation that the cell is moved so as to adjust the delay amount of the signal flowing through the signal line. Hence, the slight delay adjustment can be achieved without the large change in the layout.

What is claimed is:

1. A wiring designing method for a semiconductor integrated circuit, comprising:

calculating a capacitance formed by a signal line and a fixed line which has at least one open end output without a termination and which is adjacent to said signal line;

adjusting a line length of said fixed adjacent line based on said calculated capacitance;

calculating a delay amount of a signal flowing through said signal line; and calculating a delay difference indicative of a difference between the calculated delay amount and a predetermined delay amount, wherein said adjusting step adjusts said line length of said adjacent line based on the calculated delay difference.

2. The wiring designing method according to claim 1, further comprising:

calculating a differential capacitance corresponding to said delay difference, wherein said adjusting step adjusts said line length based on said differential capacitance and a distributed capacitance rate of said adjacent line.

3. The wiring designing method according to claim 2, wherein a control signal supplied to said adjacent line is determined based on a direction of a phase shift of the signal flowing through said signal line.

4. The wiring designing method according to claim 3, wherein when said direction of the phase shift indicates a delay of said signal flowing through said signal line, said control signal supplied to said adjacent line is set to a fixed potential.

5. The wiring designing method according to claim 3, wherein when said direction of the phase shift indicates an advance of said signal flowing through said signal line, said control signal supplied to said adjacent line is set to a first control signal having the same phase as said signal flowing through said signal line.

6. The wiring designing method according to claim 3, wherein when said direction of the phase shift indicates a delay of said signal flowing through said signal line, said control signal supplied to said adjacent line is set to a second control signal having an opposite phase to said signal flowing through said signal line.

7. A design support system for a semiconductor integrated circuit, comprising:

a routing tool which wires a signal line and a fixed line which has at least one open end output without a termination and which is adjacent to said signal line: and a timing adjustment tool which determines a line length of said fixed adjacent line based on a delay amount of a signal flowing through said signal line, wherein said timing adjustment tool:

measures a delay amount of the signal flowing through said signal line;

calculates a delay difference indicative of a difference between the measured delay amount and a predetermined delay amount; and adjusts said line length of said adjacent line based on the calculated delay difference.

8. The design support system according to claim 7, wherein the timing adjustment tool:

calculates a differential capacitance corresponding to said delay difference; and adjusts said line length of the adjacent line based on said differential capacitance and a distributed capacitance rate of said adjacent line.

9. The design support system according to claim 8, wherein said timing adjustment tool determines a phase of a control signal supplied to said adjacent line based on a direction of a phase shift of the signal flowing through said signal line.

10. The design support system according to claim 9, wherein said timing adjustment tool, when said direction of the phase shift indicates a delay of said signal flowing through said signal line, sets the control signal supplied to said adjacent line at a fixed potential.

11. The design support system according to claim 9, wherein said timing adjustment tool, when said direction of the phase shift indicates an advance of said signal flowing through said signal line, sets the control signal supplied to said adjacent line at a first control signal having the same phase as said signal flowing through said signal line.

12. The design support system according to claim 9, wherein said timing adjustment tool, when said direction of the phase shift indicates a delay of said signal flowing through said signal line, sets the control signal supplied to said adjacent line at a second control signal having an opposite phase to said signal flowing through said signal line.

13. A wiring designing method for a semiconductor integrated circuit comprising:

calculating a capacitance formed by a signal line, a first line, and a second line, the first line and the second line both having at least one open end output without a termination and being adjacent to said signal line; and adjusting a line length of the first line and adjusting a line length of the second line in order to adjust a delay amount of a signal flowing through the signal line based on said calculated capacitance, said adjustment being performed without re-routing said first and second lines.

14. A design support system for a semiconductor integrated circuit, comprising:

a routing tool which wires a signal line, a first line, and a second line, said first line and said second line both having at least one open end output without a termination and being adjacent to said signal line; and a timing adjustment tool which determines a first line length of said first line and a second line length of said second line based on a delay amount of a signal flowing through said signal line, said determination being performed without re-routing said first and second lines.

* * * * *